(12) United States Patent
Mei et al.

(10) Patent No.: US 9,001,305 B2
(45) Date of Patent: Apr. 7, 2015

(54) ULTRA-LARGE SIZE FLAT PANEL DISPLAY MASKLESS PHOTOLITHOGRAPHY SYSTEM AND METHOD

(71) Applicants: Wenhui Mei, Plano, TX (US); Weichong Du, Burnaby (CA); Lujie Qu, Shenzhen (CN)

(72) Inventors: Wenhui Mei, Plano, TX (US); Weichong Du, Burnaby (CA); Lujie Qu, Shenzhen (CN)

( * ) Notice: Subject to any disclaimer, the term of this patent is extended or adjusted under 35 U.S.C. 154(b) by 331 days.

(21) Appl. No.: 13/648,944

(22) Filed: Oct. 10, 2012

(65) Prior Publication Data

US 2013/0088704 A1    Apr. 11, 2013

Related U.S. Application Data

(60) Provisional application No. 61/545,928, filed on Oct. 11, 2011.

(30) Foreign Application Priority Data

Sep. 26, 2012    (CN) .......................... 2012 1 0363540

(51) Int. Cl.
*G03B 27/42* (2006.01)
*G03B 27/58* (2006.01)
*G03F 7/20* (2006.01)

(52) U.S. Cl.
CPC ............... *G03F 7/20* (2013.01); *G03F 7/70275* (2013.01); *G03F 7/70291* (2013.01); *G03F 7/70358* (2013.01); *G03F 7/70725* (2013.01); *G03F 7/70791* (2013.01)

(58) Field of Classification Search
CPC ............ G03F 7/70725; G03F 7/70275; G03F 7/70791
USPC .................. 355/52, 53, 55, 67; 359/291–292
See application file for complete search history.

(56) References Cited

U.S. PATENT DOCUMENTS

| | | |
|---|---|---|
| 3,937,579 A | 2/1976 | Schmidt |
| 5,285,236 A | 2/1994 | Jain |
| 5,337,151 A | 8/1994 | Baxter |
| 5,604,354 A | 2/1997 | Lauverjat |
| 5,923,403 A | 7/1999 | Jain |
| 5,933,216 A | 8/1999 | Dunn |
| 6,211,942 B1 | 4/2001 | Okamoto |
| 6,356,337 B1 | 3/2002 | Zemel |
| 6,859,223 B2 * | 2/2005 | Shirota et al. ................ 347/239 |
| 7,126,670 B2 * | 10/2006 | Hayashi ......................... 355/55 |
| 7,576,834 B2 * | 8/2009 | George et al. ................ 355/53 |
| 7,932,993 B2 | 4/2011 | Mei |
| 2002/0097475 A1 | 7/2002 | Koreeda |
| 2009/0279057 A1 | 11/2009 | Kim |

* cited by examiner

*Primary Examiner* — Hung Henry Nguyen

(57) ABSTRACT

A maskless exposure system that has multiple maskless optical engines arranged in an (N×M) matrix that form and project a pattern onto a substrate. A first stage system is capable of driving the maskless optical engines in a first direction, a second stage system capable of holding and moving the substrate in a second direction perpendicular to the first direction. A control system that processes data and synchronizing movement of the first and second stage systems and a vision system that detects the positions of the second stage system to synchronize movements with the multiple optical engines.

23 Claims, 15 Drawing Sheets

ULTRA-LARGE SIZE FLAT PANEL DISPLAY MASKLESS PHOTOLITHOGRAPHY SYSTEM AND METHOD

BACKGROUND

The present system and method relates to maskless photolithography also called direct-write digital image technology for an ultra-large size flat panel display (FPD) patterning, and more particularly, it relates to an exposure apparatus for projecting a pattern directly onto an ultra-large substrate from a computer system so that the pattern is aligned with a previously formed substrate pattern in the computer system to produce an ultra-large flat panel display and the like.

Flat panel display (FPD) substrates have widely been used as display elements for personal computers, television sets and the like. Typically, a liquid crystal display (LCD) substrate is manufactured by forming transparent thin film electrodes on a photosensitive substrate (glass substrate) by photolithography. To carry out the photolithography, projection exposure apparatuses project a mask pattern onto a photoresist layer formed on a glass substrate through a projection optical system.

Recently, it has been desired that the area of flat panel display substrate be increased, and, accordingly, to increase an exposure area of the projection exposure apparatus.

In manufacturing large thin-film transistor LCDs, mass-producing 6 or 8 panels on a single glass substrate is typically most efficient. As demand for larger and larger LCDs continues to grow, manufacturers have increased mother glass dimensions from 680×880 mm 10 years ago to up to 2880×3080 mm now in mass production. There are several companies who are building the 10th Generation factory, which uses 2880×3080-mm glass.

In order to increase the exposure area, there has been proposed an exposure apparatus of so-called step-and-scan. In step and scan, after an initial exposure, the mask and the photosensitive substrate are shifted by a predetermined distance in the direction perpendicular to the scanning direction and then another scanning-type exposure is achieved.

The pixel cell array and color filter patterning processes in LCD manufacturing create some of the greatest challenges in scaling to Gen 10, in terms of both technology requirements and manufacturing costs. Typical alpha silicon (a-Si) thin-film transistors have critical dimensions around 3.5 μm and require alignment accuracy of ±1 μm. In color filter manufacturing, only the black matrix step (a black screen like pattern formed on the color filter that prevents light leakage, improves contrast and separates RGB sub-pixels) requires less than 10 μm resolution and alignment accuracy of less than ±3 μm, RCSB pixels, spacers and vertical alignment protrusions typically do not necessitate resolution precision of less than 20 μm. Even though LCD exposure specifications are large compared with those of semiconductors, the challenges in exposing very large areas and maintaining throughput presents serious issues to be overcome.

The primary method of maintaining productivity as substrates have grown has been to increase the size of the mask and exposure field. The largest masks used in production today for Gen 8 are 1220×1400×13 mm. With a pellicle (a thin, transparent membrane that prevents particles from contaminating the mask surface) attached, these easily can cost more than $350,000 for a single binary mask. To maintain throughput at Gen 10 and expose 2880×3080 mm substrates in four scans, photolithography and mask companies are developing even larger masks in the range of 1600×1800×17 mm. Initially, these very heavy quartz masks may cost more than $1 million apiece.

In the case of array exposure, average Gen-10 machine prices are expected to be nearly six times higher than those of Gen-4 machines, white the average increase for other tool types likely will be around twice as high. In 2000, photolithography costs accounted for only 14 percent of total array equipment spending, but when Gen-10 tools begin shipping, the costs are expected to account for up to 29 percent. For these reasons, exposure is a prime target of cost-cutting strategies.

In conventional photolithography, the patterned masks or films for high resolution application are typically very expensive and have a short lifetime. In addition, the photomasks are characterized as requiring a very long lead time. The long mask lead time is a problem when a short product development cycle is desired. Further, if a particular mask design is found to require a design change, no matter how small the change, then mask modification cost and lead time to implement the required change can cause serious manufacturing problems.

At present there is a need for a viable alternative to conventional photolithography for mass production that can meet all of the requirements of the pixel cell array process in LCD manufacturing.

SUMMARY

The present system and method has solved these previously stated problems and describes a system for mass production of ultra large flat panel displays that meets production registration requirements and allows immediate correction of any design issue.

An object of the present system and method is to provide a maskless exposure apparatus which can realize full scanning exposure of an ultra-large exposure area with excellent imaging performance and low running cost, short cycle time and without lowering the manufacturing throughput. One of the technical advances is achieved by a novel maskless optical engine and method for photolithography which provides a digital image from a spatial light modulator (SLM) writing directly onto specific sites on an ultra-large size substrate with vision systems which detect alignment marks and errors between the maskless engine and the site of the ultra-large substrate. The spatial light modulator acts to form a pixel image on the surface of a substrate. The system may also be designed with two conjugate points, one of which is coincident with said spatial light modulator and another conjugate point coincident on the substrate. The end result overcomes the disadvantages of the conventional exposure systems which are long, mask lead time and high cost of the photomasks.

In the present system and method, the maskless scanning exposure apparatus performs an ultra-large maskless exposure that utilizes UV light sources, spatial light modulators (SLM), maskless optical engines, motion stage systems, reference position sensors, vision systems, a control system, data conversion and data processing software utilized in a computer system. It is envisioned that the exposure apparatus light source may include ultraviolet, infrared, visible light, electron beam, ion beam, and X-ray sources.

The general method is to generate pattern data from the computer and expose photoresist on the surface of an ultra-large size substrate through spatial light modulators (SLM) that are imaged by a maskless optical system (maskless optical engine) over a moving stage. Spatial light modulators may include DMD, LCOS, LCD and other 2D display panels.

The maskless composite engine may include to position detector which ma be a CCD camera, or laser position detector or other position detector to read the position of a reference line or marks which are fixed on the stage or the substrate. The maskless composite engine may also include real-time image generation to form an image on the substrate front the designed pattern, at the position where the control system reads the stage encoders and position detectors. The maskless composite engine may also include an auto-focus system which detects the focus distance to the surface of the ultra-large substrate and adjusts the maskless optical engine position to get the best focus at anytime.

In order to achieve the objects described above, an ultra-large size FPD maskless exposure system of a first aspect of the present system and method includes an ultra-large substrate with photo sensitive material, a maskless composite engine which is set above the substrate and includes a maskless optical engine with an exposure light source (maskless optical engines can share one light source by a beamsplitter). The system may also include a vision system with a light source, the wavelength of which is different from light used to expose photoresist on the substrate. The vision system may be mounted with each of the maskless optical engines and aligned to the optical axis with the maskless optical engine axis that a beamsplitter nearly transparent for exposure light and partially reflective for the vision system light. The vision system may monitor the position of the optical engine at the start position. The function of the vision system is to check optical engine position and also align the exposure pattern with the ultra-large substrate position. The maskless optical engine may have an individual controlled Z axis stage to change the distance between the maskless optical engine and substrate by auto-focus detect function. The maskless optical engine may have a Y axis motion stage which is controlled by a control system and synchronized with maskless optical engines, the stave can make relative moving between maskless optical engines and the substrate. In one embodiment, the system includes one row of the above maskless composite engines for generating the pattern and for creating a plurality of pixel elements by SLM on the ultra-large substrates.

The maskless composite engines art mounted on an X stage which is controlled by the control system. There may be two reference position sensors which are fixed above the edges of the Y stage along the scanning direction, during operation. There may be a reference line or mark under the each reference position sensor which is located on the stage or on the substrate. The system may also include position marks on the stage under the maskless composite engines at the start points of the scans. The position marks may also indicate the end point and line of movement. In general, the exposure region of the maskless optical engine is a rectangle shape and the rectangle is tilted an angle relative to the scanning direction about 1~10 degree according to exposure parameter selection.

If the ultra-large substrate surface has no pattern, the maskless composite engines can directly read the reference marks on the stage from the vision system to ascertain the correct position. The two reference position sensors may read the position and calculate the errors in a direction perpendicular to the scanning direction for the stage position relative to the reference lines. The errors may include Y stage yaw, straight and pitch errors during translation, temperature variation and vibration induced errors.

The computer system may generate the image data based on the position information, then turn on the exposure light source and start the scan. When the stage is scanning, the two reference position sensors read the stage position so that the position error may be calculated corrected for by updating the image data sent to the maskless optical engines. If a prior pattern exists on the substrate surface, the vision systems may read the mark positions in the pattern and save the position data of the substrate in the computer and correct exposure data.

If a multi-scan is to be performed on the entire substrate, the X stage translates a distance of the width of the exposure region and the vision system reads the marks at the each start point of the scan for each maskless engine. In this case, the exposure regions through the respective maskless optical engines are formed on the ultra-large substrate so that a sum of the lengths along the scanning direction is constant over the direction perpendicular to the scanning direction. The amount (dose) of exposure light is set to be constant over the entire surface of the substrate.

At the intersection of two scans the overlay is referred to as the stitch area. Due to the tilt, of the substrate, the stitch area is smoothed from one scan to the next, so that multi-scan exposure can achieve a large exposure area with accurate and smooth exposure even with compact maskless optical engines and small exposure regions. Also, if each maskless optical engine is compact, scanning exposure can be made while minimizing occurrence of aberrations and keeping excellent imaging performance. To increase the exposure speed, several rows of the maskless engines also can be added in a staggered arrangement.

Another aspect of the present system and method includes a substrate with photo sensitive, material on the both sides, a matrix of maskless composite engines set above the substrate. The M×N matrix of maskless composite engines are on a same plane above the XY stage and are aligned in M rows and N columns in X and Y direction respectively. An XY motion stage is controlled by a control system and synchronized with the maskless composite engines. The XY stage translates the substrate relative to the maskless composite engines. A reference mark plate or mask plate with the stage or the substrate is transparent to the exposure light source and reflect the vision system light. The reference mask includes lines and marks for the maskless composite engines and is located on vision system focus plane. In general, the exposure region of the maskless optical engine is rectangular and is tilted an angle relative to the scanning direction about 1~10 degree according to exposure parameter selection. The first and second stages may move in a dimensional plane parallel to the substrate.

In the exposure process, the exposure light sources are first turned off and the vision system light sources are turned on. If the ultra-large substrate surface has no pattern, the vision system of the maskless composite engine can directly read the mark on the reference mark plate to correct the stage position. The vision system also may include a reference position sensor to read the position for position error calculation of the stage relative to the reference marks or lines. The computer system generates image data based on the position information for each maskless composite engine and then turns on the exposure light source to scan in the Y or X direction.

During scans, the errors of the stage position are fed back to the computer system from the vision systems and the corrected image data are send to each maskless optical engines for exposing. If there is a prior pattern on the substrate surface, the vision systems can read the mark positions in the pattern and then save the substrate position data in the computer and correct exposure data.

If a multi-scan for the entire substrate is to be performed, the stage is translated a distance of the width of the exposure region at X direction (or Y direction) and the vision systems reads the marks at the each start point of the scans for each maskless engine, in this case, the exposure regions through the respective maskless optical engines are formed on the ultra-large substrate so that a sum of lengths along the scanning direction is constant over the direction perpendicular to the scanning direction. The amount of exposure light is set to be constant over the entire surface of the substrate.

The region between the overlay of two scans is referred to as the stitch area. Due to the tilt of the substrate, the stitch area is smoothed from one scan to the next. There is also a stitch area between the exposure areas of maskless optical engines at the start or end of each scan. To smooth this stitch area, a grey scale exposure mode or as control the exposure light intensity to get smooth transition from one engine to the next engine is used, so that multi-scan exposure can achieve a large exposure area with accurate and smooth exposure on the whole substrate.

The present system and method aims to eliminate the above-mentioned drawbacks in a conventional exposure system, and an object of the present system and method is to provide a maskless exposure apparatus having alignment mark detection system with each maskless optical engine which can greatly improve accuracy in alignment of patterns with a simple arrangement.

It is further object of the present system to provide a maskless exposure system that has multiple maskless optical engines arranged in an (N×M) matrix that form and project a pattern onto a substrate. A first stage system is capable of driving the maskless optical engines in a first direction, a second stage system capable of holding and moving the substrate in a second direction perpendicular to the first direction. A control system processes data and synchronizes movement of the first and second stage systems and a vision system that detects the positions of the second stage system to synchronize movements with the optical engines.

One method of projecting a pixel-mask pattern onto a plate has a first side coated with a first photosensitive material and a second side coated with a second photosensitive material. The method uses a plurality of maskless optical engines, forming and projecting a pattern onto a substrate, driving the maskless optical engines in a first direction, moving the substrate in a second direction perpendicular to the first direction, synchronizing the driving of the first stage system and the moving of the second stage system, and detecting positions of the second stage system to synchronize movements with optical engines.

The present system and method will become more fully understood from the detailed description given herein below and the accompanying drawings which are given by way of illustration only, and thus are not to be considered as limiting the present system and method.

The scope of applicability of the present system and method will become apparent from the detailed description given hereinafter. However, it should be understood that the detailed description and specific examples, while indicating preferred embodiments of the system and method, are given by way of illustration only, since various changes and modifications within the spirit and scope of the system and method will become apparent to those skilled in the art from this detailed description.

BRIEF DESCRIPTION OF THE DRAWINGS

The above and other objects, features and other advantages of the present system and method will be more clearly understood from the following detailed description when taken in conjunction with the accompanying drawings, in which.

DETAILED DESCRIPTION

Figure 1:
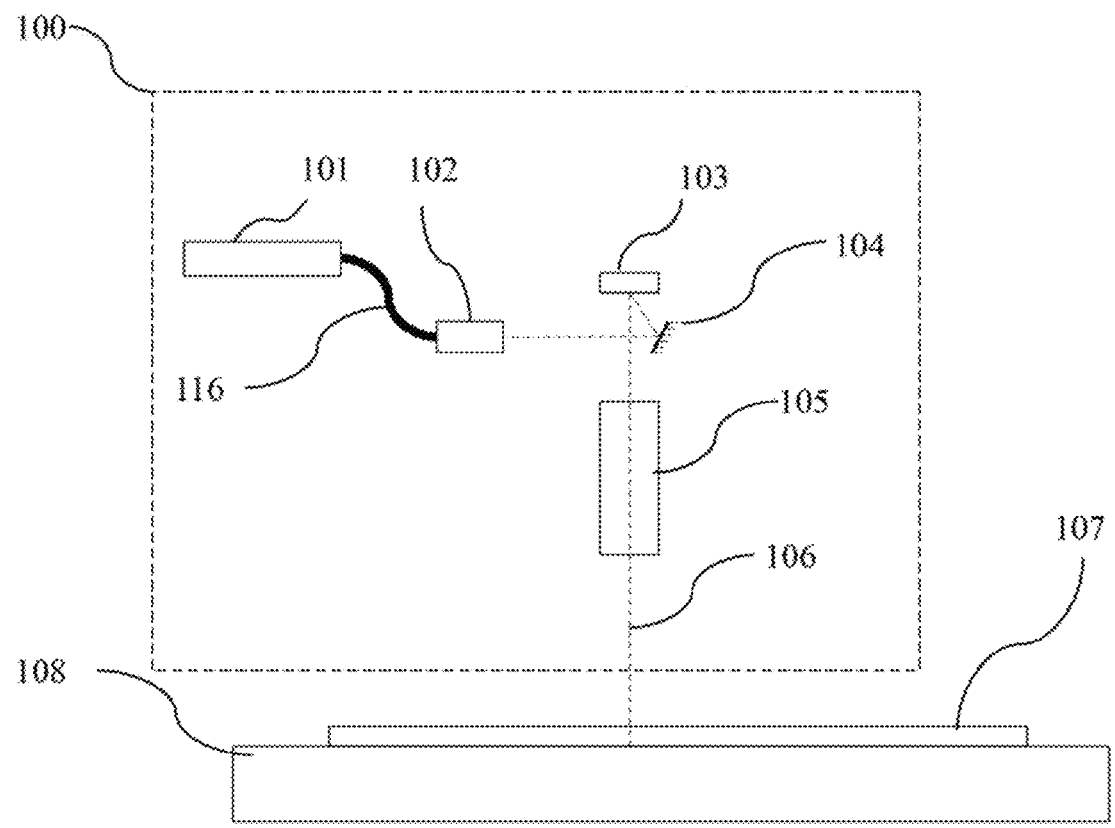
FIG. 1 is a basic diagram illustrating a maskless optical engine.

The present disclosure relates to an ultra-large size maskless exposure system, such as can be used in PCB, LCD, and other photolithographic processing. It is understood, however, that the following disclosure provides many different embodiments, or examples, for implementing different features of one or more systems and methods. Specific examples of components and arrangements are described below to simplify the present disclosure. These are, of course, merely examples and are not intended to limit the present disclosure from that described in the claims.

Reference will now be made in greater detail to an exemplary embodiment of the system and method, an example of which is illustrated in the accompanying drawings. Wherever possible, the same reference numerals may be used throughout the drawings and the description to refer to the same parts for easy description and understanding.

With reference now to FIG. 1, a simple maskless exposure system includes a light source 101 with a optical fiber 116 and light collimator and homogenizer 102 the output light is reflected by mirror 104 to a spatial light modulator (SLM) 103, a optical lens 105 images SLM 103 to a subject 107. A resist layer or coating may be disposed on the surface of the subject 107. The light collimator and homogenizer 102 provide a uniform tight beam onto the SLM 103, a stage surface plate 108 is to hold the substrate 107. The stage surface plate 108 can move XY direction by a control system. The SLM 103 creates a desired pixel pattern (the pixel-mask pattern). The pixel-mask pattern may be available and resident at the SLM 103 for a desired, specific duration which is synchronized with the stage surface plate movement. Light emanating from for through) the pixel-mask pattern of the SLM 103 then passes through the optical system 105. The light from optical system 105 focuses onto the top surface of the substrate 107. The substrate 107 may be a LCD glass plate, PCB board, or semiconductor wafer. It is understood, however, that many different substrates can benefit from the present system and method, including for further example, a non-flat substrate. It is desired to project a plurality of patterns on the substrate 107 using the maskless exposure system. There are Z axis moving mechanisms for focus adjustment of maskless optical engine 100.

Figure 2:
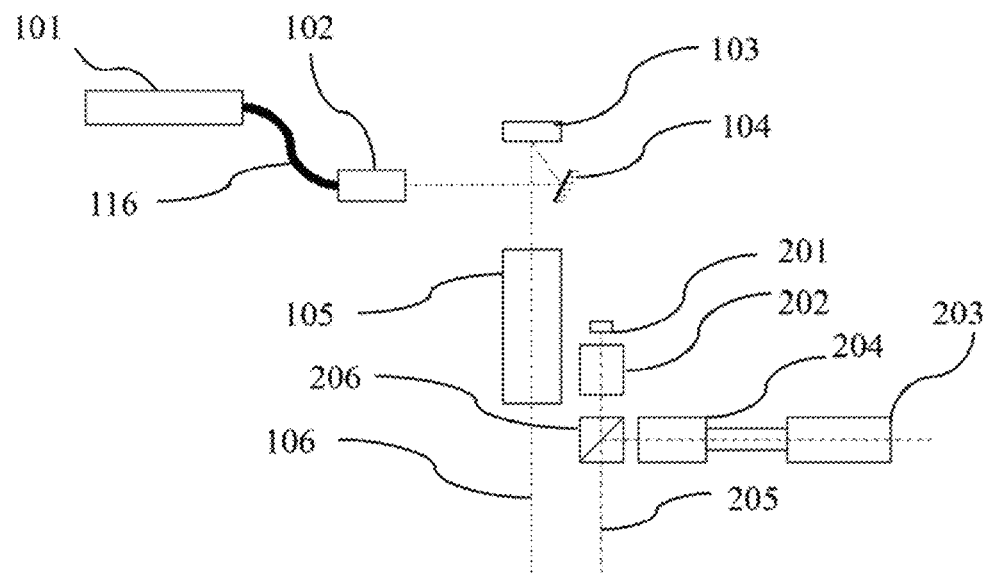
FIG. 2 illustrates a maskless optical engine with a vision system.

FIG. 2 shows a maskless exposure system with a vision system. A vision system consist of a camera 203, an image lens 204, a light source 201 which does not expose the photo sensitive material on the substrate 107, such as yellow or red light. A collimation lens 202 is to collect the light from the light source 201 and illuminates the substrate 107 thru a beamsplitter 206 which generally has approximately half light reflection and half transmission. The light is reflected back from the substrate 107 and goes to camera lens 204 and camera 203. The camera reads the pattern on the substrate if a pattern is present. In this example, this vision system reads the mark, the vision system optical axis is not aligned with maskless optical system axis 106. If the maskless optical system axis 106 shifts due to temperature, vibration or other factors, the vision system lacks inline feedback to correct for the error. To check the optical axis alignment exposure testing and measure of the optical axis 205,106 positions is required.

Figure 3:
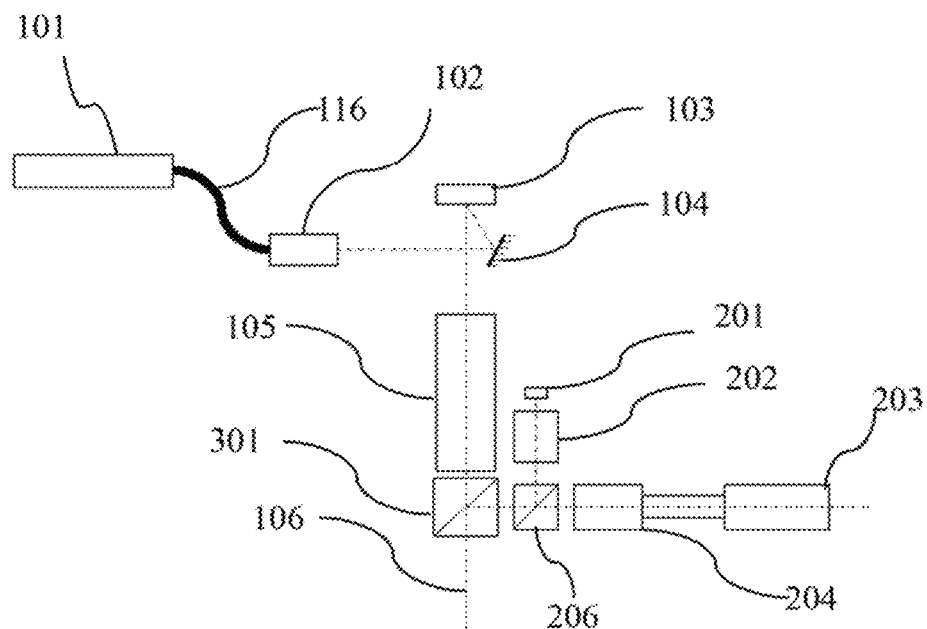
FIG. 3 illustrates a maskless optical engine with a co-axial vision system.

FIG. 3 shows an approach for maskless optical system alignment by utilizing a co-axis vision system. In this example a beamsplitter 301 is added to the front of the optical system 105. The purpose of the beamsplitter 301 is to combine the vision system axis and maskless optical system axis 106. The beamsplitter 301 is almost transparent for the light from the light source 101 and semi-reflects the light from light source 201. The optical system 105 requires optimization of beamsplitter 301 to improve image quality.

Figure 4:
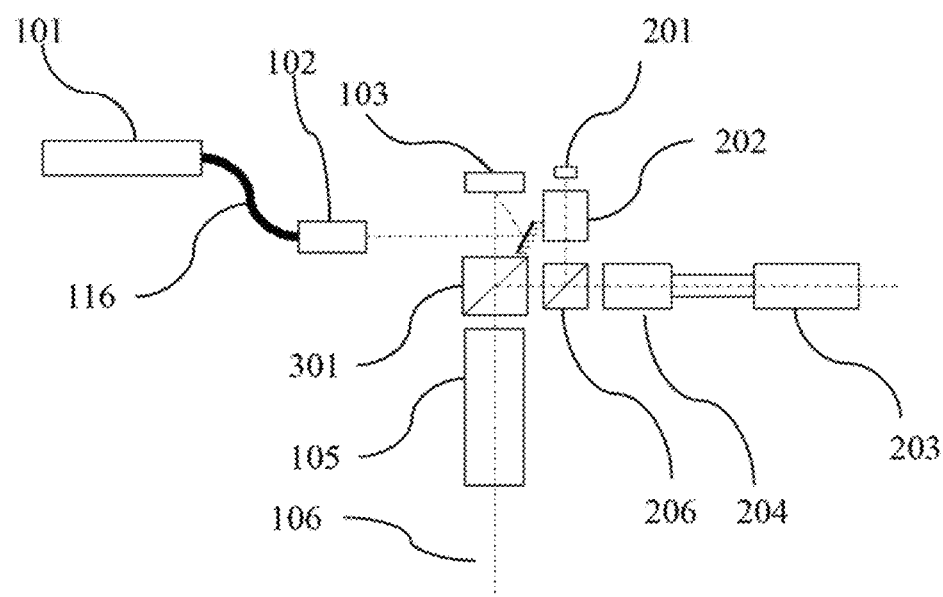
FIG. 4 illustrates another embodiment of FIG. 3.

FIG. 4 shows another approach having a function similar to FIG. 3. In this example the vision system and beamsplitter 301 are set proximate to SLM. Additionally, the camera lens 204 may be removed if the working distance of the optical system 105 allows.

The maskless optical engines in FIG. 1, FIG. 2, FIG. 3, and FIG. 4 are simple maskless engine 100 in FIG. 1 which is called Gen-1 maskless system. There are Gen-2 and Gen-3 of the maskless systems which can replace the maskless optical engines for higher performance.

Figure 5:
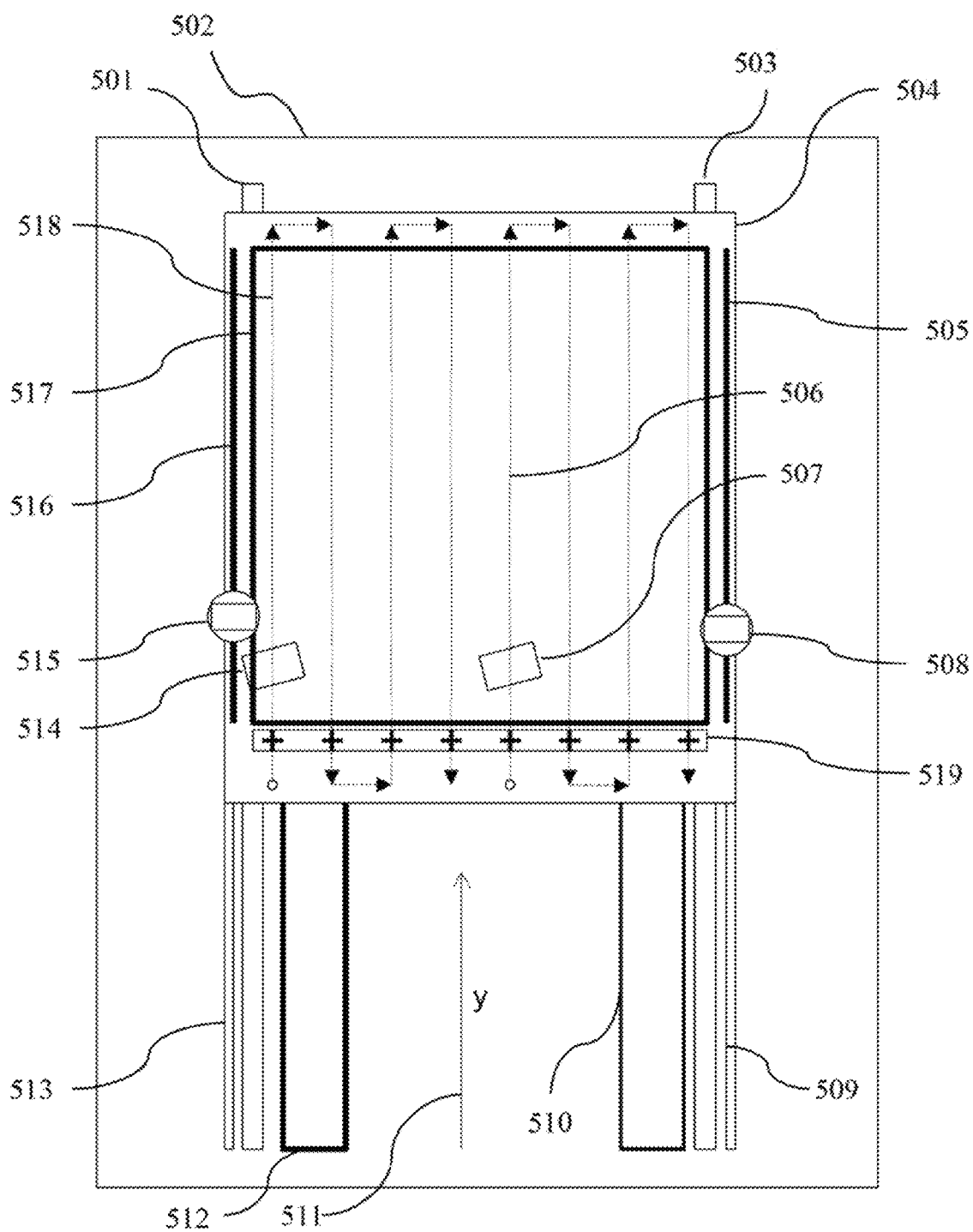
FIG. 5 illustrates an ultra-large size maskless exposure system with two maskless optical engines and two reference position sensors by multi-scans.

FIG. 5 shows a maskless system of the present system and method that includes two of the maskless composite engines in FIG. 3 or FIG. 4 as regions 507, 514 at a row for generating the pattern and for creating a plurality of pixel elements on the ultra-large substrate 517. The substrate 517 is held in place by a vacuum table 504 which can move along the 511 direction (Y) and be synchronized with the maskless composite engines by a control system. The regions 507, 514 are images projected from the two maskless composite engines on the substrate 517. The maskless composite engines are mounted on an X stage (not show here) which is controlled by the control system also. There are two reference position sensors 515,508 which are fixed on the X stage bridge above the edges of the table 504 along the scanning direction Y.

A reference line 516,505 (or mark) is located under the each reference position sensor 515,508 which is located on the stage 504 or on the substrate 517. Position marks (cross marks) 519 are located on the stage 504 under the maskless composite engines at the start points of each scan. In general, the exposure regions 514,507 of the maskless optical engines rectangular shaped 514,507 and are tilted at an angle relative to the scanning direction Y about 1~10 degree according to exposure parameter selection.

The Y stage 504 is supported by two linear bearings 501, 503 which sit on a granite base 502 with vibration isolators (not show here). Due to the size of the Y stage, there are two linear motors 512,510 on the both sides of the stage 504 and two linear encoders 513,509 for Y stage position feedback. During exposure, at first, the exposure light sources are turned off and the vision system light sources of the maskless optical engines are turned on. If the substrate surface 517 is unpatterned, the vision systems can directly read the marks 519 on the stage 504 to correct the position. The two reference position sensors 515,508 read the position for error calculation in the direction perpendicular to the scanning direction Y. Y stage 504 position errors may include yaw, straight and pitch errors during translation. The computer system generates the image data based on the position information and then turns on the exposure light source to start the scan. When the Y stage 504 is scanning, the two reference position sensors 515,508 read the Y stage position errors in the direction perpendicular to the scanning direction, and then the computer system corrects the image data and sends the data to the two maskless composite engines. If there is a pattern on the substrate surface, the vision systems of the maskless composite engines reads the alignment mark positions on the substrate and saves the position data in the computer. The corrected the image data is matched to the substrate position for exposure. If a multi-scan in FIG. 5 is required for the entire substrate, the X stage translates a distance equal to the width of the exposure region 514,507 and the vision systems reads the marks 519 at the each start point of the scan for each maskless engine.

If during the scan, the two encoders 513,509 do not match, the two sides of the Y stage are not at same position, as an example;

assume there is a difference dy=Y1−Y0, where Y0 is data from encoder 513 and Y1 is data from encoder 509, so that based on each maskless optical engine X position, the Y position of the maskless engine can be calculated by, $Y = dy*X/L + Y0.$ where L is the distance between two encoders.

The computer generates the data according to Y for the synchronization of each maskless composite engine. The maskless composite engines 507 514 each scan four times 518,506 for entire substrate exposure.

Figure 6:
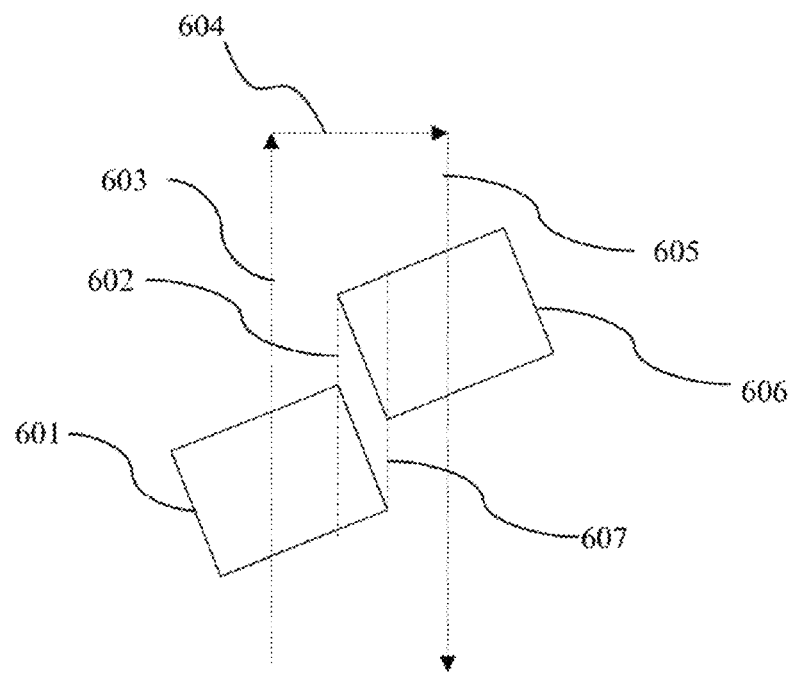
FIG. 6 illustrates a stitch area by two scans.

FIG. 6 illustrates a stitch area between two scans, in the case of FIG. 5, the maskless exposure system will expose multiple regions through the respective maskless optical engines 514,507 formed on the ultra-large substrate 517. Multiple exposure regions 601,606 are arranged so that the sun of pixel lengths along the scanning direction 603,605 is constant over the direction perpendicular to the scanning direction 603,605, so that the amount of exposure light is constant over the entire surface of the substrate 517. Since the exposure regions 601,606 are tilted and the exposure regions 601,606 are arranged so that the sum of widths of exposure regions along the direction perpendicular to the scanning direction 603,605 is constant over the scantling direction 603,605. There is a stitch area 602,607 between scans which is overlaid, by two scans 603,605. Due to the tilt of rectangles 601,606, the stitch area between lines 602,607 is smooth transition from one scan to next scan, so that multi-scan exposure can achieve a large exposure area with accurate and smooth exposure on the whole substrate. Also, since each maskless composite engine is compact, scanning exposure can be made while minimizing occurrence of aberrations and keeping excellent imaging performance. To increase the exposure speed, several rows of the maskless engines also can be added in a staggered arrangement.

Figure 7:
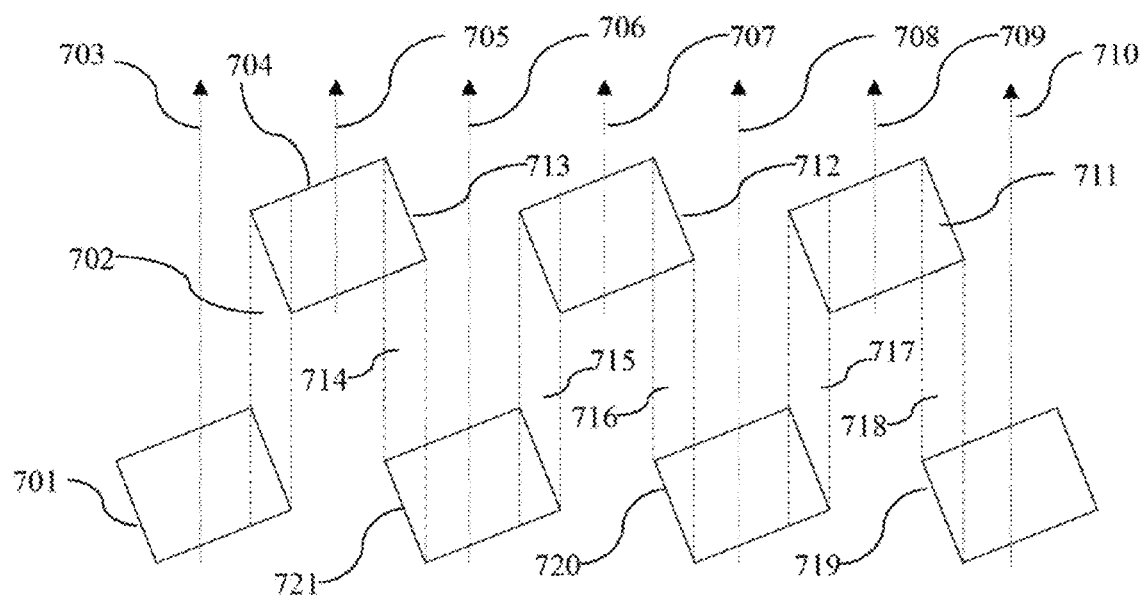
FIG. 7 illustrates stitch areas with two stagger rows of maskless optical engines for a whole area exposure by one scan.

In FIG. 7 illustrates stitch areas from two staggered rows of maskless composite engines, in this case, one scan can be done for a whole substrate exposure. The exposure regions 701,721,720,719 are on the first row and the exposure regions 704,712,711 are on the second row. The first row will scan along the paths 703,705,708,710 and the second row will scan along the paths 705,707,709. There are stitch areas as 702, 714,715,716,717,718. Since the pitch of the maskless engines is same as the effective scan width of each maskless optical engine, this staggered engine setup does not need an X stage.

Figure 8:
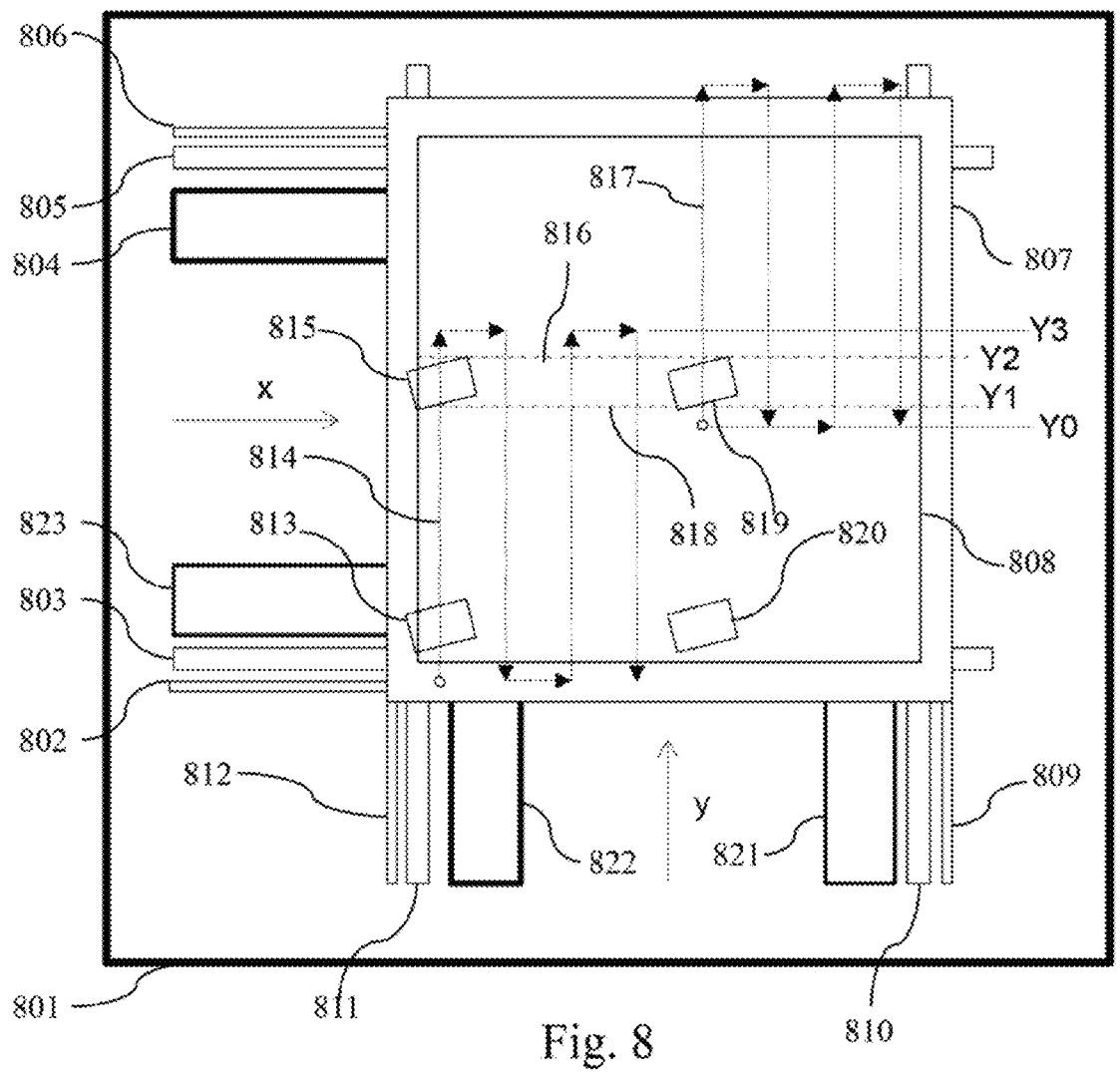
FIG. 8 illustrates a matrix maskless exposure system of the present system and method.

FIG. 8, is an alternate embodiment of the example shown in FIG. 5. The substrate 517 is translated at in the Y direction and maskless composite engines 507,514 are translated in the X direction. The maskless exposure system in FIG. 8 utilizes same maskless composite engines as FIG. 5 but the substrate 808 is moved, in both XY directions. Y direction in this instance is the scanning direction. There are four maskless composite engines 813,815,819,820 formed a matrix above the substrate 808. The XY stage is also set on a granite base 801 which is supported by vibration isolators (not show here). There are two pairs of encoders 806,802,812,809 for X and Y direction positions. Since there is a 2×2 matrix of maskless optical engines, the XY stage travel length just need about ½×½ of the substrate size 808. The maskless composite engines 813,815,819,820 are mounted above the substrate 808 with a Z axis or individual Z axis for focusing. The engine 813 scans along line 814 and the engine 819 scans along line 817. There are two lines 818,816 which indicate an overlay area from two rows of engines 813,820 and 815,819. Since this overlay area is in a direction perpendicular to the scanning direction, the tilt of maskless optical engines do not assist in smoothing the transition from one maskless engine exposure area to next maskless engine exposure area. One way of smoothing the transition is to use a grey scale exposure between lines 818,816 but in binary exposure pattern case, a grey scale exposure may not be applied. The solution is to decrease the light source output of the first maskless engines 813,820 and increase the light source output of the second maskless engines 815,819 between the lines 818,816. The scan of engines 813,820 starts or stops at Y3 line and the engines 818,816 are turned off when the scan speed is decreased to zero front Y2 to Y3. The scan of engines 815,819 starts or stops at Y0 line and the engines 815,819 are turned off when the scan speed is decreased to zero from Y1 to Y0.

Figure 9:
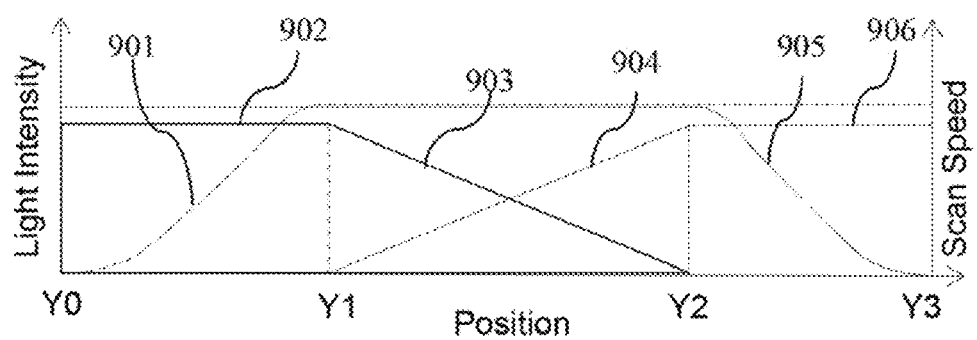
FIG. 9 illustrates a stitch area vs. a light intensity change for adjacent two maskless engines in the scanning direction.

FIG. 9 illustrates the light intensity and scan speed change between Y0 and Y3. The lines 902,903 indicate the light output of engines 813,820 versus positions and the lines 904, 906 show the light output of the engines 815,819. The curve 905 shows the speed of the engines 813,820 and the curve 901 shows the speed of the engines 815,819.

Figure 10:
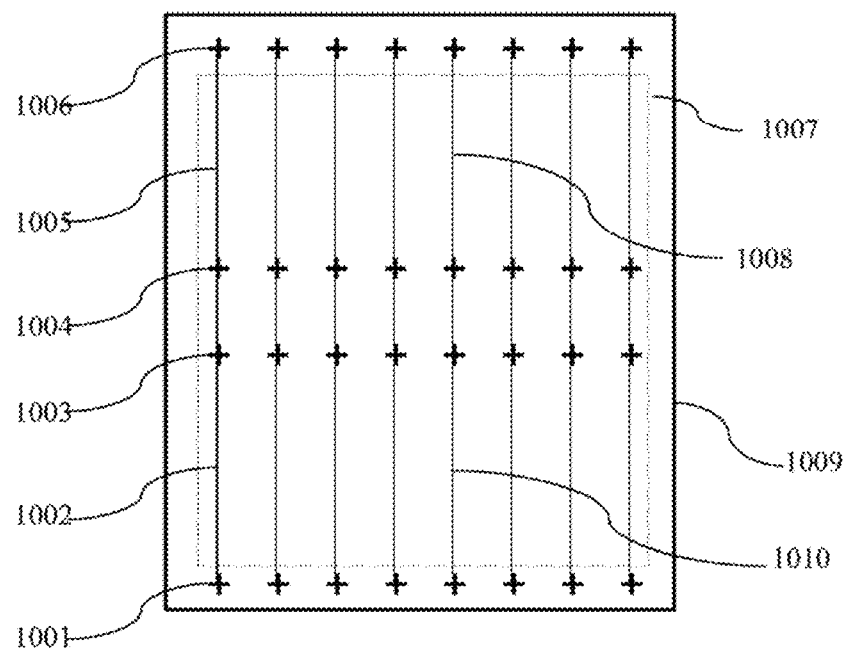
FIG. 10 illustrates reference mark plate layout.

FIG. 10 illustrates a reference mark plate for the system in FIG. 8. Due to the fact that the stage 807 moves in both the X and Y directions, the reference mark can't be same as the system in FIG. 5. To correct the position of stage 807 a plate is required that shows whole tracks of the maskless composite engines. In FIG. 10, the rows of cross marks 1001,1004 are the start points or stop points of the engines 813,820 and the rows of cross marks 1003,1006 are the start points or stop points of the engines 815,819. The line 1002 is the scanning track of the engine 813. The line 1005 is the scan track of the engine 815, and line 1002 and 1005 are identical. The line 1010 and 1008 are the scanning tracks of the engines 820 and 819. The rectangular area 1007 is the effective exposure area.

Figure 11:
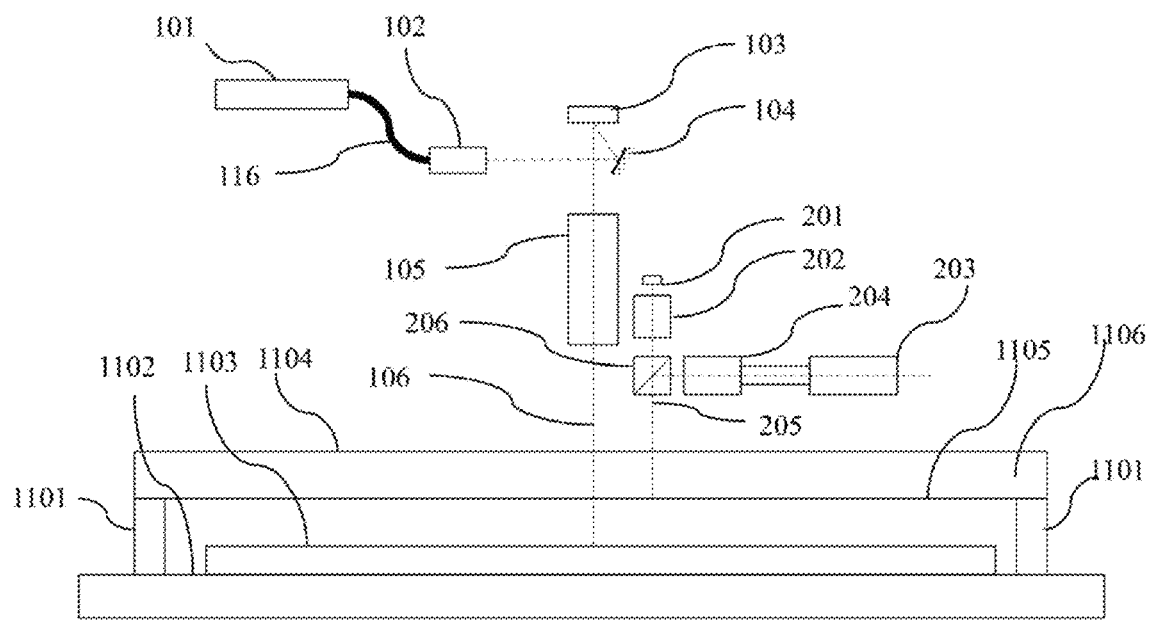
FIG. 11 illustrates reference mark plate installation for a matrix maskless exposure system.

FIG. 11 illustrates the reference mark plate position in the maskless system FIG. 8. The reference mark plate 1106 is a transparent glass plate for the exposure light 101 and it is fixed on the XY stage 1102 by connectors 1101. The maskless composite engine generates and projects an image on the surface 1103 of the substrate 808. The reference marks can be on the surface 1104 or 1105. The marks are transparent for the exposure light source 101 and reflect the vision system light 201. The vision system focuses on the mark surface rather than the substrate surface 1103. In other embodiments, the maskless composite engine can be replaced by the engines in FIG. 3 and FIG. 4. There several methods to make the surface 1103 the focus plane of the vision system. A first method is to design the reference mark as hologram on the surface 1104 or 1105 and design a virtual reference mark are on the surface 1103. A second method is to design the reference marks on the surface 1104 and coat the surface 1105 with a film that reflects light 201 but is transparent for the exposure light source 101. Therefore, the surface 1105 acts as a mirror for the reference mark on the surface 1104. If the distance between the surface 1104 and 1105 is equal to the distance between surface 1103 and 1105 then the virtual image of the reference marks on the surface 1104 appears to be located on the surface 1103. Due to the fact that the marks on the reference plate are typically very fine lines or dots, the vast majority of vision system light 201 passes thru the surface 1104 without image quality degradation, so the light can reflect back from the surface 1105 to the detector 203.

Figure 12:
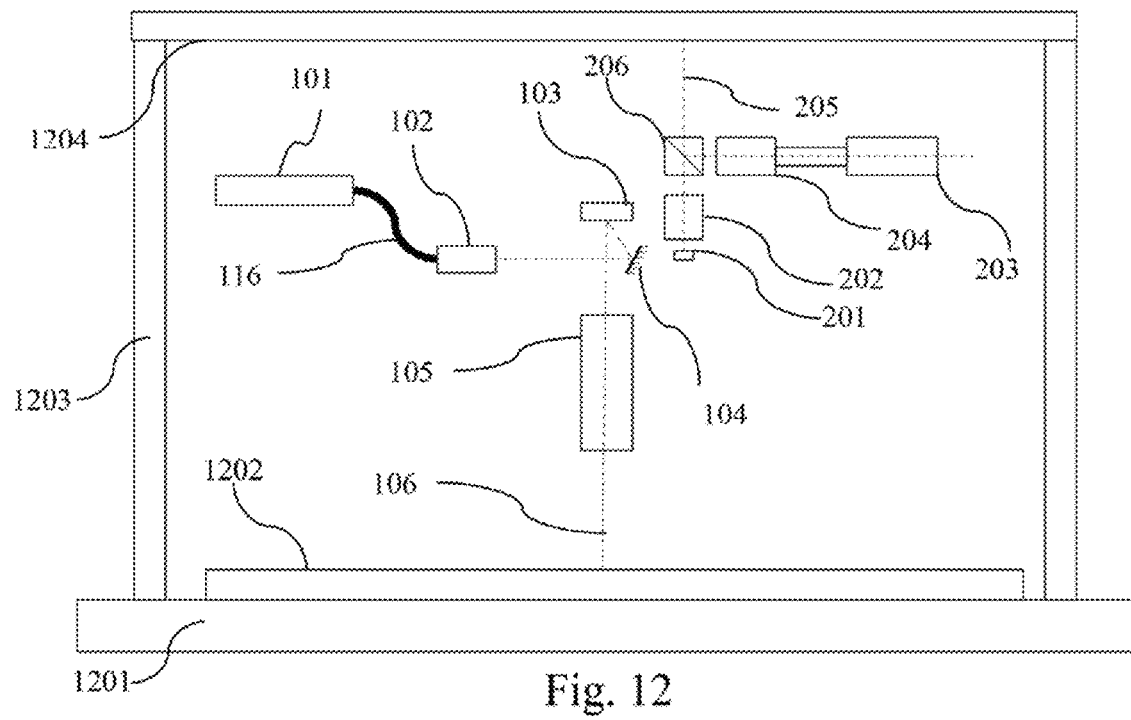
FIG. 12 illustrates reference mark plate installation on top of the system for a matrix maskless exposure system.

FIG. 12 illustrates an embodiment of the reference mark plate location in FIG. 11. The reference mark plate 1204 is placed on the top of the maskless composite engines and the vision system focuses on the top rather than the substrate surface 1202. The reference mark plate 1204 is connected with the stage 1201 by the parts 1203. The marks may not be transparent for the light source 101 and 201.

Figure 13:
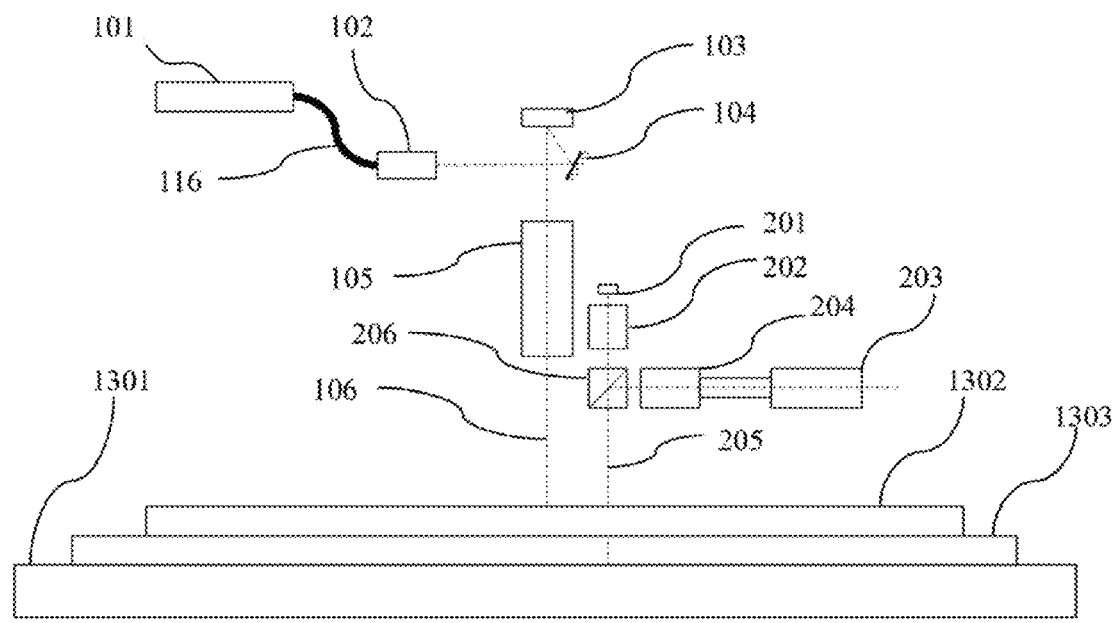
FIG. 13 illustrates reference mark plate installation on the top of the stage for a matrix maskless exposure system.

FIG. 13 shows an embodiment of the reference mark plate location in FIG. 11. The reference mark plate 1303 is placed under the substrate and the vision system focuses on the reference marks thru the substrate surface 1302. The reference mark plate 1204 is directly connected with the stage 1301. In this case, the substrate must be transparent to the light source 201.

Figure 14:
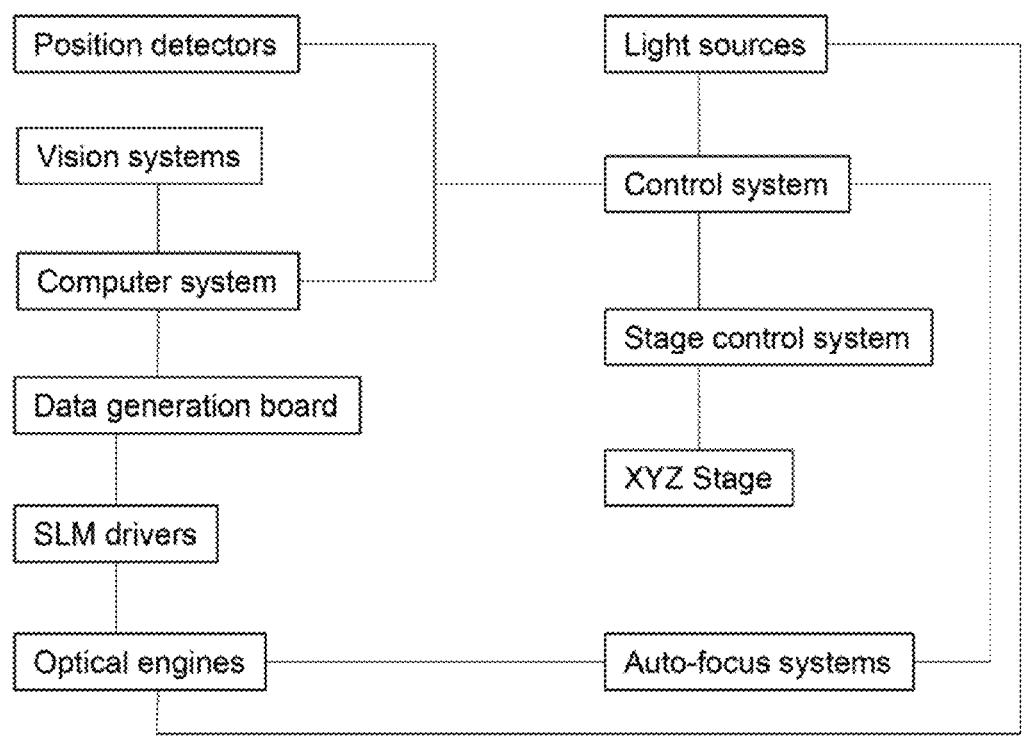
FIG. 14 illustrates block diagram of a maskless exposure system.

FIG. 14 shows a system block diagram which includes basic parts for a maskless exposure system in the present system and method.

Figure 15:
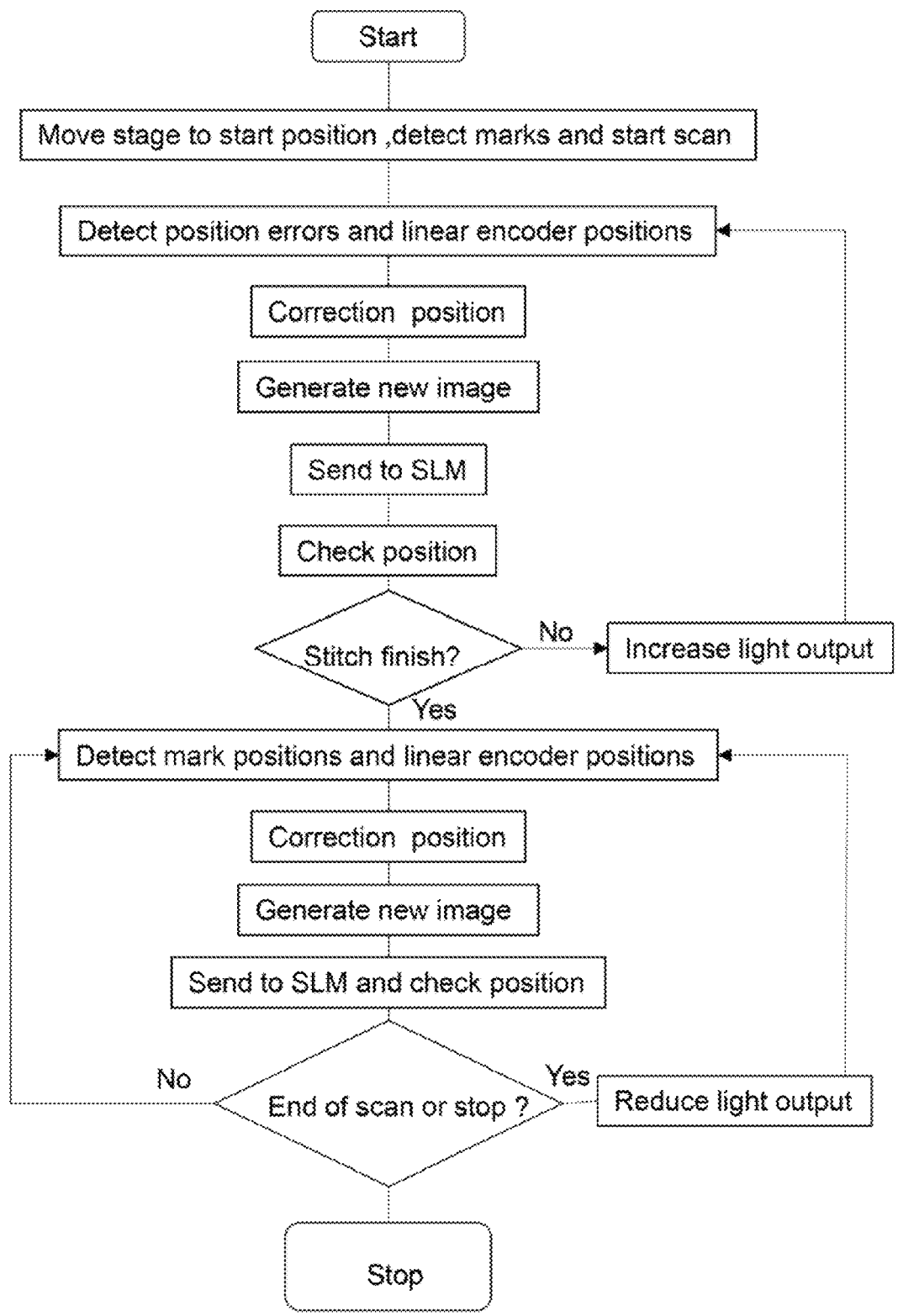
FIG. 15 illustrates flow chart for a maskless exposure of the present system and method.

FIG. 15 illustrates the flow chart of a maskless exposure system. This is just for one scan.

Figure 16:
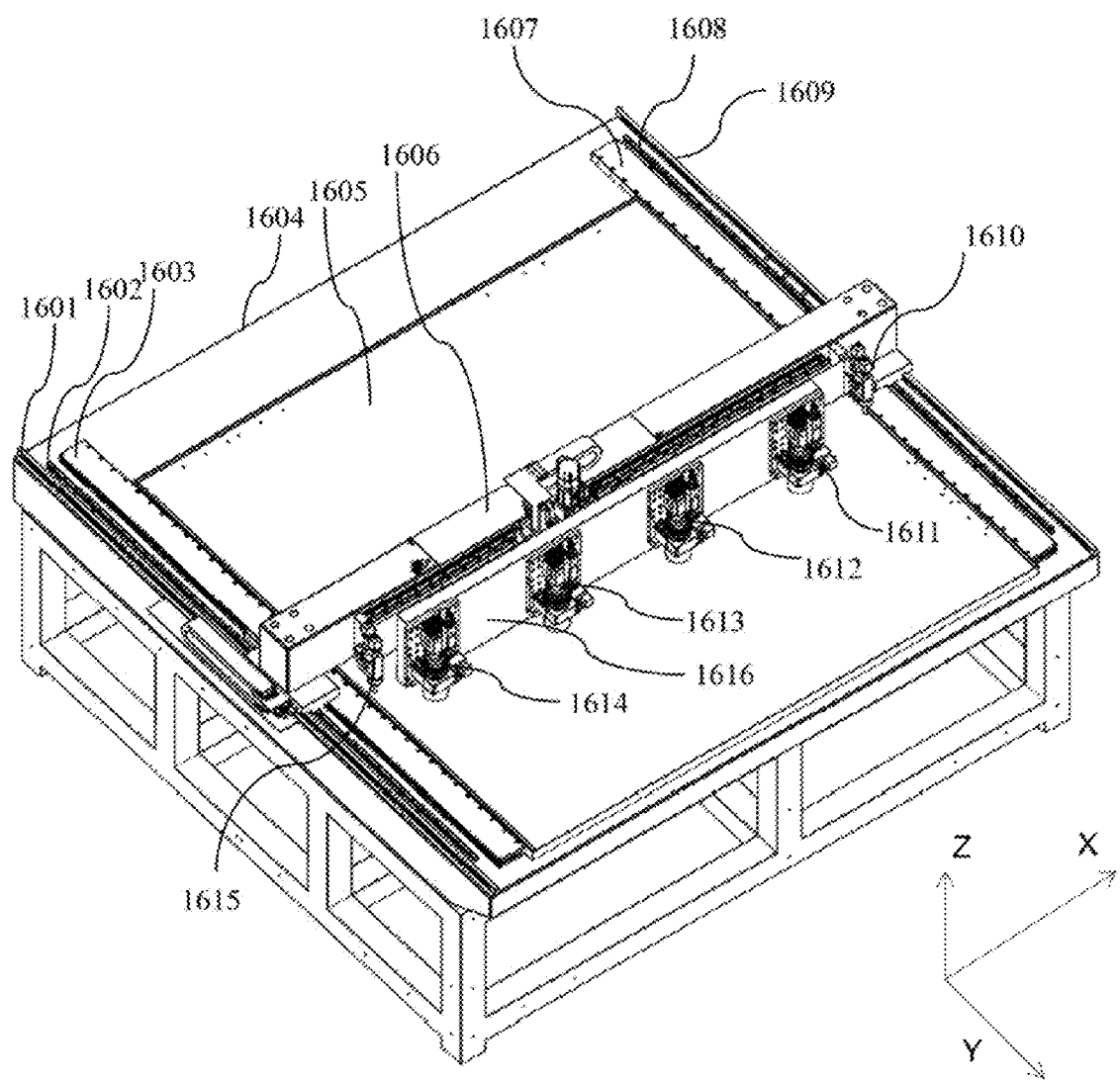
FIG. 16 illustrates a perspective view of a system design of the present system and method.

FIG. 16 illustrates a perspective view of a system design of the present system and method. The system includes four maskless composite engines 1614, 1613, 1612, 1611 on the XYZ stage 1616. The each engine can have an individual Z stage for auto-focus function. The substrate 1605 does not move on the base plate 1604. The engines 1614, 1613, 1612, 1611 scan relative to the substrate 1605. The bridge 1606 is driven by two linear motors 1603, 1607 with linear encoders 1601,1609 in Y direction and set on the linear bearings 1602, 1608. There are two reference position sensors 1615,1610 on the bridge 1606 to detect position errors relative to reference lines which are indicated in FIG. 5. The reference marks are fixed on the base plate 1604.

Figure 17:
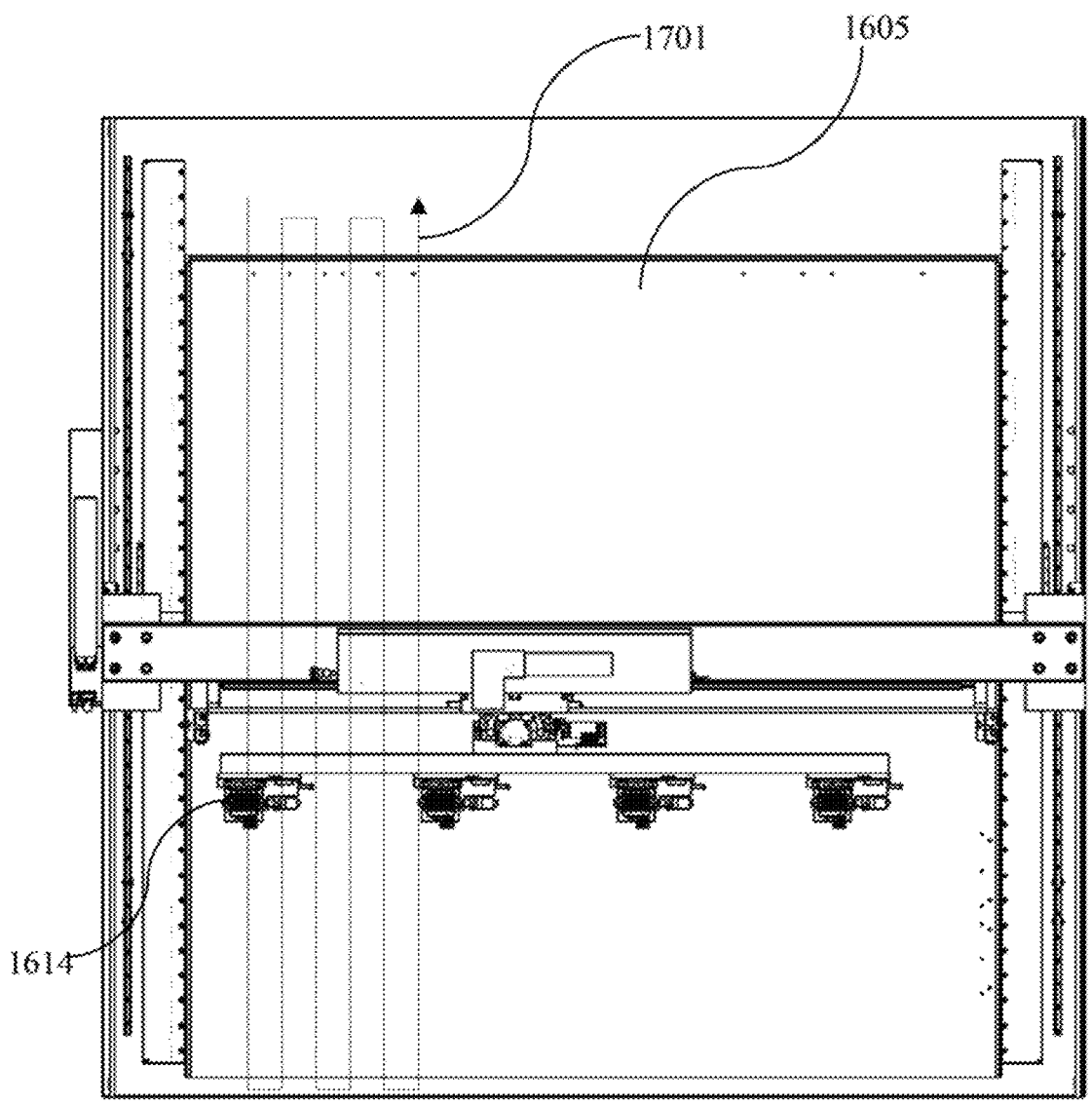
FIG. 17 illustrates a top view of FIG. 16.

FIG. 17 illustrates a top view of FIG. 16. The substrate 1605 does not move in this system. The track 1701 shows the scan path of the engine 1614 and other engines.

Figure 18:
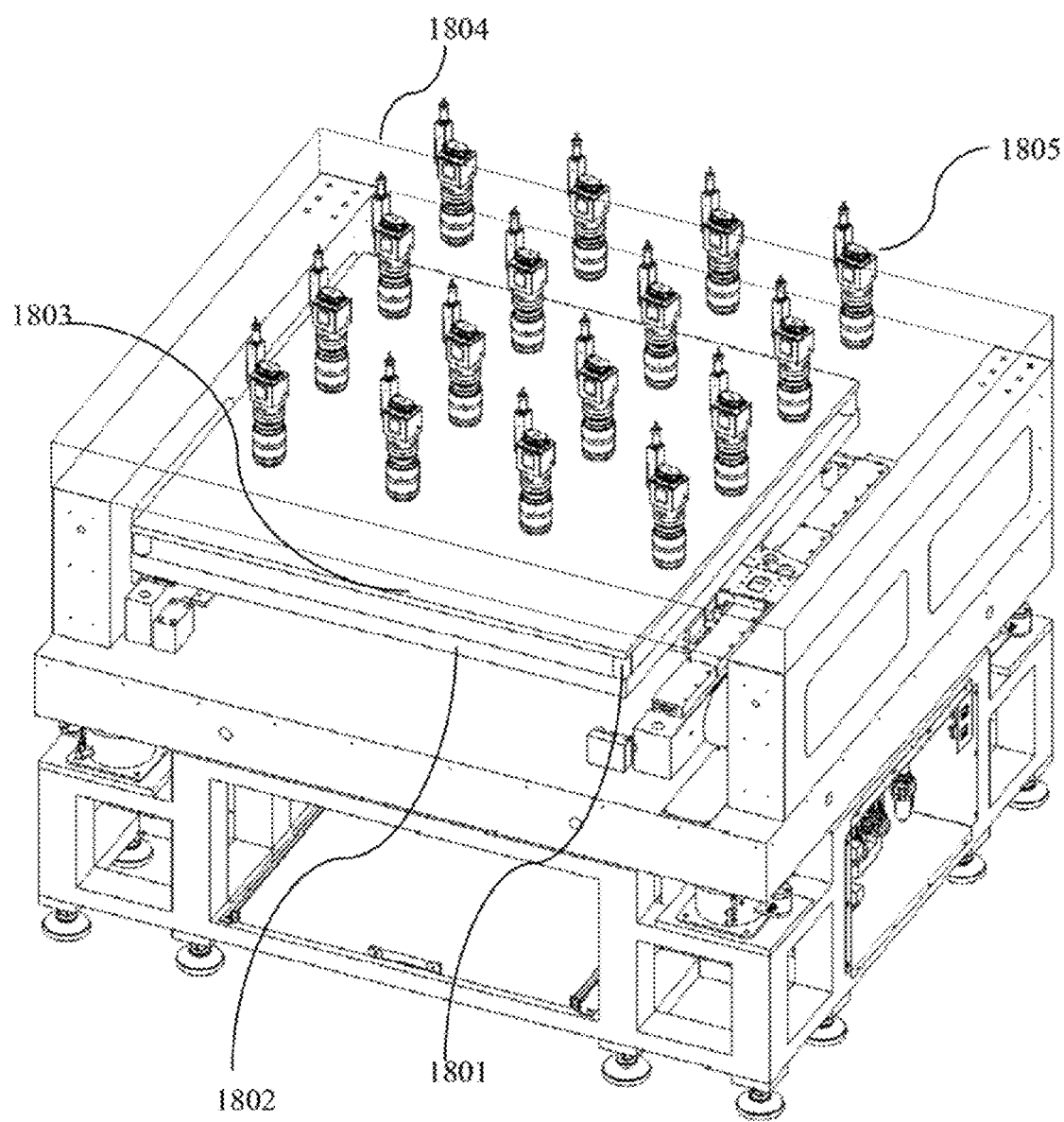
FIG. 18 illustrates a perspective view of a system design of the present system and method.

FIG. 18 illustrates a perspective view of a system design of the present system and method. There is 4×4 matrix of maskless composite engines 1805 which are mounted on the granite plate 1804. The reference mark plate is put on the XY stage 1802 as in FIG. 11 with connection 1801.

Figure 19:
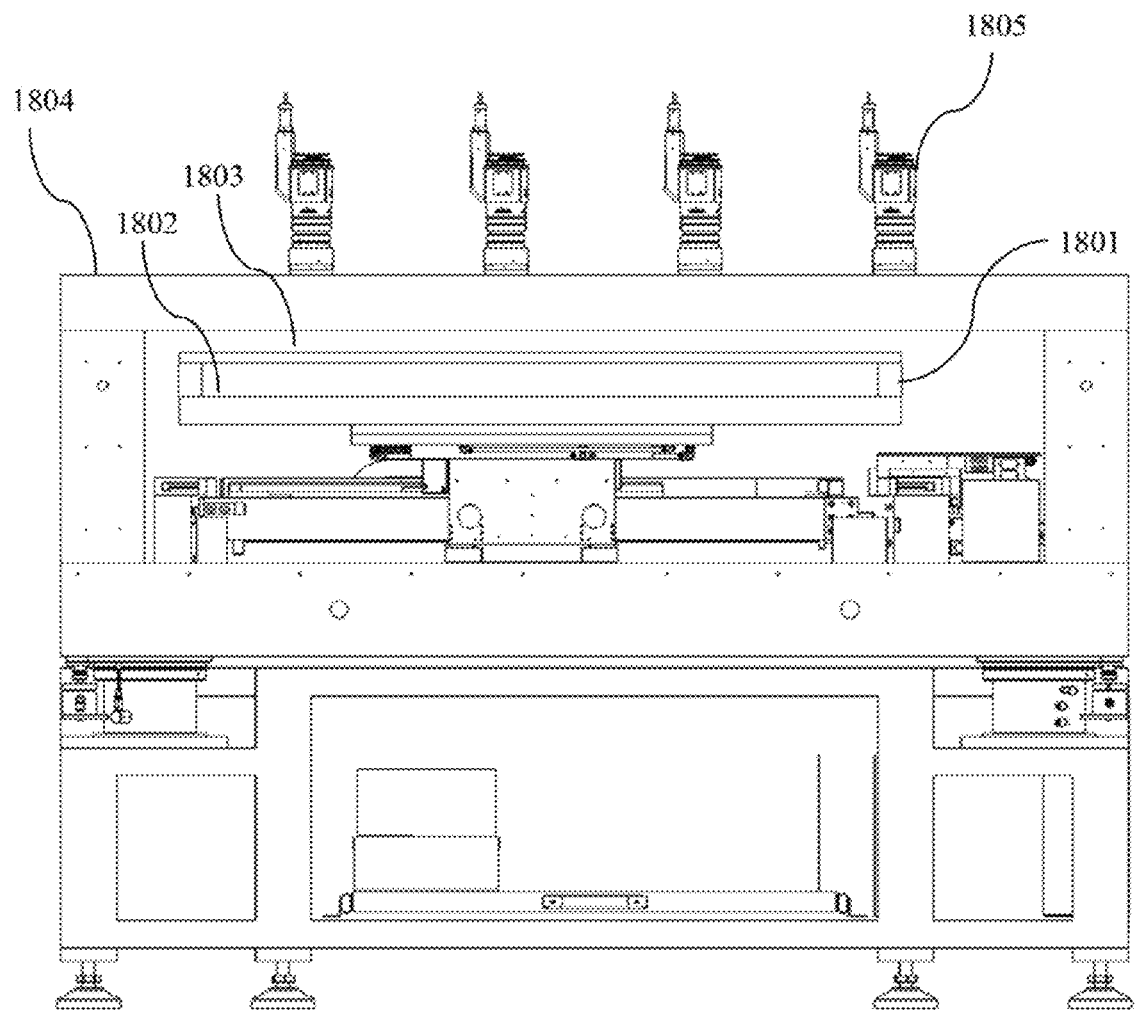
FIG. 19 illustrates a front view of FIG. 18.

FIG. 19 illustrates a front view of FIG. 18. As in FIG. 11, the reference mark plate 1803 is located between the matrix engines and substrate so the vision system in the engine 1805 focuses on the reference mark plate which is above the XY stage 1802.

Figure 20:
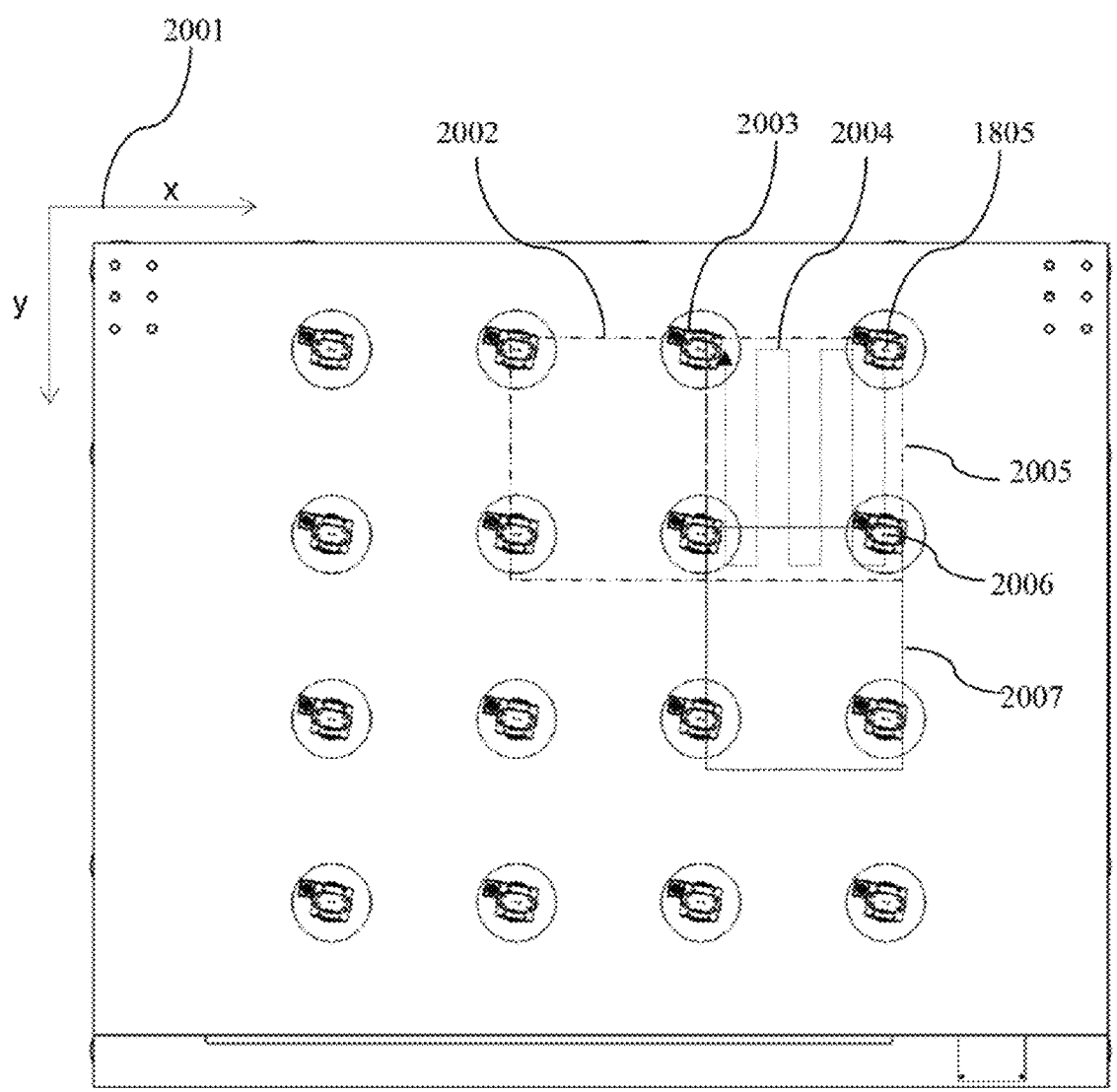
FIG. 20 illustrates a top view of FIG. 18.

FIG. 20 illustrates a top view of FIG. 18. The rectangles 2002, 2005, 2007 show the scan areas for engines 2003, 1805, 2006 respectively. The track 2004 shows the scan path of the engine 1805. Since there is a 4×4 matrix of the maskless engines, each engine exposes about 1/(4×4) area on the substrate. The XY stage just needs ¼ X and ¼ Y travel length of the substrate size.

Figure 21:
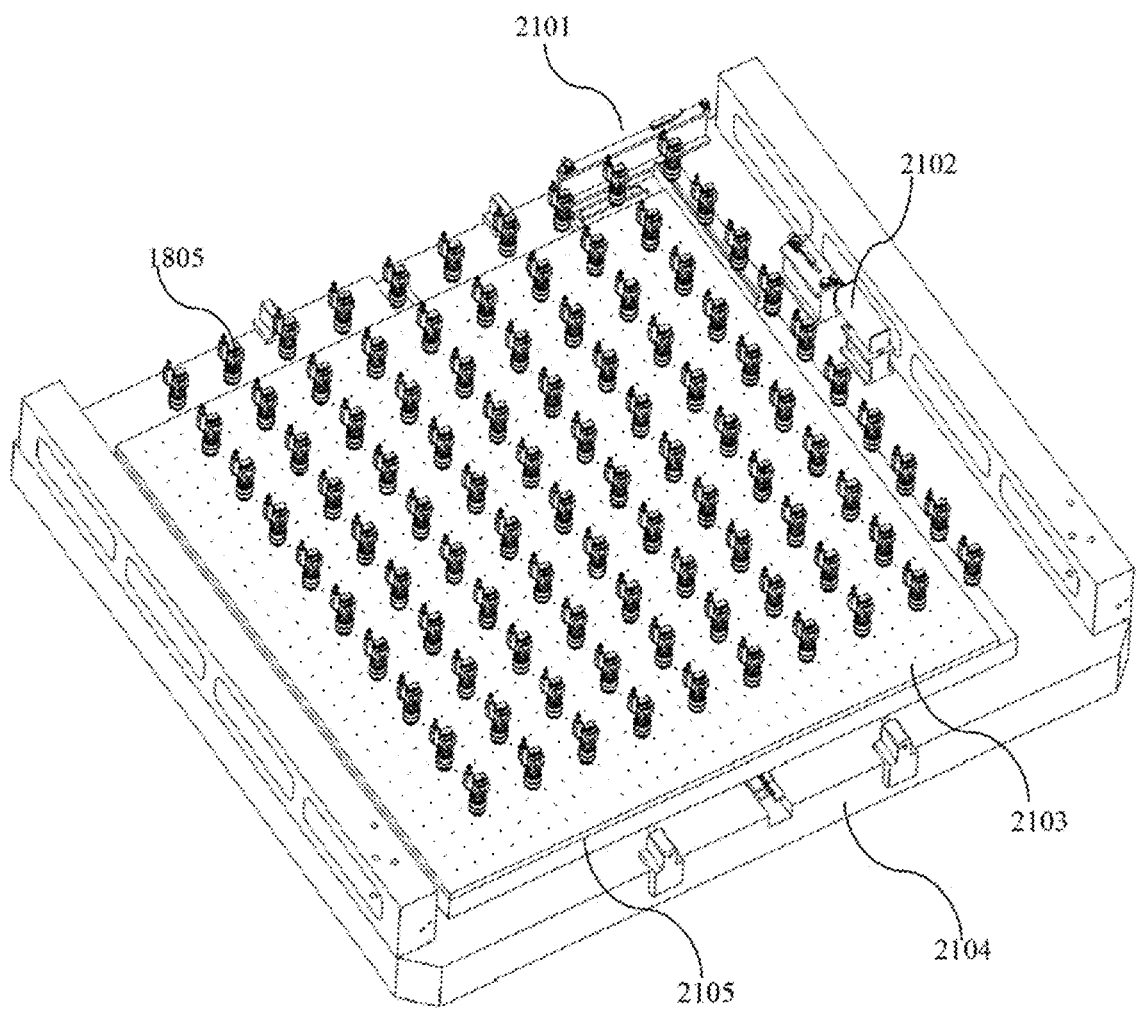
FIG. 21 illustrates a perspective view of an ultra-large system design of the present system and method.

FIG. 21 illustrates a perspective view of an ultra-large system design of the present system and method. The system includes 10×10 maskless engines 1805 in a matrix. The stage 2105 is set on the granite base 2104 and moves in both the X and Y directions. The XV position of the stage 2015 is measured by laser interferometers 2102, 2101. The size of the substrate 2103 may be up to 3 meters×3 meters. The XY stage 2105 just needs to move 1/10 of the substrate size which means about 300 mm in this example. The reference mark plate can be located on the top of the matrix engine or above the substrate 2103.

A calibration system may also be part of the system in which a first calibration light source emits a first calibration light whose wavelength spectra does not photo-react the photo sensitive material on the substrate and communicably coupled to the control system. The system may include a first beamsplitter, where the first calibration light is sent through the first beamsplitter and reflected from the second stage system or the substrate and a first camera system, where the first calibration light is sent back to the camera system through the first beamsplitter. The calibration system may also include a second calibration light source that emits a second calibration light whose wavelength spectra does not photo-react the photo sensitive, material on the substrate, the second calibration light source is communicably coupled to the control system, a second beamsplitter that splits an input light into the maskless optical engines, where the second calibration light is sent through the second beamsplitter and reflected from the second stage system or the substrate. The system may also include a third beamsplitter, and a second camera system, where the second calibration light is sent hack to the second camera system through the second and third beamsplitters.

While the system and method has been particularly shown and described with reference to the preferred embodiment thereof, it will be understood by those skilled in the art that various modifications, additions and substitutions in form and detail may be made therein without departing form the spirit and scope of the system and method, as set forth in the following claims.

What is claimed is:

1. A maskless exposure system comprising:
    a plurality of maskless optical engines that form and project a pattern onto a substrate, wherein said plurality of optical engines are arranged in a matrix of M rows and N columns;
    a first stage system coupled to said maskless optical engines, said first stage system drives said maskless optical engines in a first direction; and
    a second stage system that holds and moves said substrate in a second direction perpendicular to said first direction;
    a control system communicably coupled to said second stage system, said control system processes data and synchronizes the drive of said first stage system with the movement of said second stage system;
    a vision system communicably coupled to said control system, said vision system detects a position of said second stage system to synchronize movements with said plurality of optical engines;
    a reference mark late that is adjacent to said second stage and separate from the substrate, and marks a set of moving positions of said plurality of maskless optical engines wherein said marks including a start point, an end point and a line of movement for each maskless optical engine; and
    wherein control system is configured to coordinate the change of light intensity and scan speed of each maskless optical engine along the direction of its movement to smooth the transition from one maskless engine's exposure area to next adjacent maskless engine's exposure area so that the pattern can be seamlessly exposed to all parts of the substrate.

2. The system in claim 1 wherein said first and second directions are moving in a dimensional plane parallel to said substrate further comprising:
    two reference position sensors located adjacent to said second stage system, wherein said reference positions sensors detect position errors of said second stage system during operation; and
    two reference lines located below said position sensors on sides of said second stage system or substrate and aligned parallel to said second direction.

3. The system of claim 2 further compromising:
    a reference mark located on said second stage system or said substrate that identifies a start point of at least one of said optical engine to correct position errors and wherein said optical engine further comprises a vision system to calibrate a relative position of said maskless optical engines and said substrate.

4. The system of claim 2 wherein said maskless optical engine further comprising a focus system that projects said pattern onto a surface of said substrate.

5. The system of claim 1 wherein said first direction is orthogonal to said second stage system that translates said substrate in a third direction that is perpendicular to said second direction and parallel to said substrate; and
    wherein said second stage system further comprises a reference position sensor for said third direction that detects positions of said second stage system in the third direction.

6. The system of claim 1 wherein said reference mark plate is fixed on said second stage system, wherein said reference mark plate is located on top of said substrate and underneath said plurality of mask less optical engines and wherein said reference mark plate is transparent to light from said plurality of maskless optical engines and reflective to light from the vision system.

7. The system of claim 1 wherein said reference mark plate moves simultaneously with said substrate and is located underneath said substrate and wherein said substrate is transparent to a light from the vision system.

8. The system of claim 1 wherein said reference mark plate is fixed on said second stage system and located on top of said plurality of maskless optical engines.

9. The system of claim 1 wherein vision system further comprising:
a first calibration light source that emits a first calibration light, wherein said first calibration light source emits a wavelength spectra does not cause a photo-reaction of the photo sensitive material on the substrate, said first calibration light source is communicably coupled to said control system;
a first beamsplitter, wherein said first calibration light is sent through said first beamsplitter and reflected from said second stave system or said substrate; and
a first, camera system, wherein said first calibration light is sent back to said camera system through said first beamsplitter.

10. The system of claim 9 further comprising:
a second calibration light source that emits a second calibration light, wherein said second calibration light source emits a wavelength spectra does not cause a photo-reaction of the photo sensitive material on the substrate, said second calibration light source is communicably coupled to said control system;
a second beamsplitter that splits an input light into said maskless optical engines, wherein said second calibration light is sent through said second beamsplitter and reflected from said second stage system or said substrate;
a third beamsplitter; and
a second camera system, wherein said second calibration light is sent back to said second camera system through said second and third beamsplitters.

11. The system of claim 10 wherein said second beamsplitter is located between said maskless optical engines and said substrate.

12. The system of claim 10 wherein said second beamsplitter is located between a spatial light modulator and an optical system of said maskless optical engine.

13. The system of claim 1 wherein said maskless optical engine further comprising:
an exposure light source that exposes a photo sensitive material on a surface of said substrate;
a spatial light modulator that forms a pixel image on said surface of said substrate; and
an optical system arranged having one of two conjugate points coincident with said spatial light modulator of said optical engine and another conjugate point located on said substrate.

14. The system of claim 13 wherein said exposure light includes at least one of ultraviolet, infrared, visible light, electron beam, ion beam, and X-ray.

15. The system of claim 13 wherein the optical system of said maskless optical engine further comprises:
an optical lens that projects the image from said spatial light modulator onto said substrate.

16. A method of projecting a pixel-mask pattern onto a plate having a first side coated with a first photosensitive material, said plate having a second side coated with a second photosensitive material, said method using a plurality of maskless optical engines arranged in a matrix of M rows and N columns:
forming a pattern;
projecting said pattern onto a substrate;
driving said maskless optical engines in a first direction; and
moving said substrate in a second direction perpendicular to said first direction;
synchronizing said driving of a first stage system and said moving of a second stage system;
detecting positions of said second stage system to synchronize movements with said plurality of optical engines;
marking the moving positions of said plurality of maskless optical engines wherein said marks including a start point, an end point and a line of movement;
calibrating, at least one relative position with said substrate; and
coordinating the change of light intensity and scan speed of each maskless optical engine along the direction of its movement to smooth the transition from one maskless engine's exposure area to next adjacent maskless engine's exposure area so that the pattern can be seamless exposed to all parts of the substrate.

17. The method of claim 16 wherein said driving, and said moving directions are parallel to said substrate, said method further comprising:
referencing said second stage system; and
detecting position errors relative to said second stage system during operation.

18. The method of claim 17 wherein said driving and said moving directions are parallel to said substrate, said method further comprising:
identifying a start point of at least one optical engine to correct position errors; and
calibrating at least one relative position of said maskless optical engines and said substrate.

19. The method of claim 16 wherein said first direction is vertical to said second stage system, said method further comprising:
moving said substrate in a third direction that is perpendicular to said second direction and parallel to said substrate; and
detecting positions of said second stage system in the third direction to synchronize movements with said plurality of maskless optical engines.

20. The method of claim 19 further comprising:
moving simultaneously a reference mark plate with said substrate.

21. The method of claim 16 further comprising;
exposing a photo sensitive material on a surface of said substrate; and
forming a pixel image on the surface of said substrate.

22. The method of claim 21 wherein said exposing includes at least one of ultraviolet, infrared, visible light, electron beam, ion beam, and X-ray.

23. The method of claim 21 further comprising:
projecting an image from a spatial light modulator onto said substrate.

* * * * *